(12) United States Patent
Joo et al.

(10) Patent No.: US 8,749,132 B2
(45) Date of Patent: Jun. 10, 2014

(54) ORGANIC LIGHT EMITTING DEVICE AND METHOD OF MANUFACTURING THE SAME

(75) Inventors: Won-jae Joo, Seongnam-si (KR);
Jhun-mo Son, Yongin-si (KR);
Hye-yeon Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 497 days.

(21) Appl. No.: 12/482,106

(22) Filed: Jun. 10, 2009

(65) Prior Publication Data

US 2010/0141123 A1 Jun. 10, 2010

(30) Foreign Application Priority Data

Dec. 4, 2008 (KR) .................. 10-2008-0122603

(51) Int. Cl.
*H01J 1/62* (2006.01)
*H01J 63/04* (2006.01)

(52) U.S. Cl.
USPC ............... 313/504; 313/506; 445/23; 445/24; 445/25; 427/66

(58) Field of Classification Search
USPC .................. 313/504–506; 445/23–25; 427/66
See application file for complete search history.

(56) References Cited

U.S. PATENT DOCUMENTS

| | | | | |
|---|---|---|---|---|
| 6,121,726 A * | 9/2000 | Codama et al. | ............... | 313/504 |
| 6,396,208 B1 * | 5/2002 | Oda et al. | ...................... | 313/504 |
| 6,433,487 B1 * | 8/2002 | Yamazaki | .................. | 315/169.3 |
| 6,476,550 B1 * | 11/2002 | Oda et al. | ...................... | 313/504 |
| 6,542,207 B1 * | 4/2003 | Yoshizawa | ...................... | 349/69 |
| 6,583,805 B2 * | 6/2003 | Mashimo et al. | ............. | 347/241 |
| 6,630,684 B2 * | 10/2003 | Lee et al. | .......................... | 257/40 |
| 6,717,359 B2 * | 4/2004 | Kimura | .......................... | 313/506 |
| 6,734,624 B2 * | 5/2004 | Tada et al. | ..................... | 313/506 |
| 6,781,307 B2 * | 8/2004 | Lee | ................................ | 313/506 |
| 6,831,407 B2 * | 12/2004 | Cok | ............................... | 313/504 |
| 6,881,501 B2 * | 4/2005 | Yudasaka | ....................... | 428/690 |
| 6,998,775 B2 * | 2/2006 | Sugiura et al. | ................ | 313/512 |
| 7,001,237 B2 * | 2/2006 | Lee | ................................ | 445/25 |
| 7,427,223 B2 * | 9/2008 | Kimura | ........................... | 445/23 |
| 7,433,000 B2 * | 10/2008 | Kato et al. | ...................... | 349/69 |
| 7,455,563 B2 * | 11/2008 | Do et al. | ......................... | 445/23 |
| 7,633,221 B2 * | 12/2009 | Wakita et al. | ................. | 313/506 |
| 7,674,407 B2 * | 3/2010 | Takakuwa et al. | ............. | 264/1.7 |
| 7,733,011 B2 * | 6/2010 | Cina et al. | ..................... | 313/504 |
| 7,759,861 B2 * | 7/2010 | Fujimoto et al. | ............... | 313/506 |
| 7,786,665 B2 * | 8/2010 | Nakanishi et al. | ............ | 313/504 |

(Continued)

FOREIGN PATENT DOCUMENTS

| JP | 11-111464 A | 4/1999 |
|---|---|---|
| JP | 2002270379 A | 9/2002 |

(Continued)

OTHER PUBLICATIONS

Korean Office Action with English Translation for Application No. 10-2008-0122603 dated Jan. 28, 2010.

(Continued)

*Primary Examiner* — Thomas A Hollweg
(74) *Attorney, Agent, or Firm* — Cantor Colburn LLP

(57) ABSTRACT

An organic light emitting device ("OLED") including a substrate; a plurality of polymer beads disposed on a substrate; a light emitting layer covering the plurality of polymer beads and having an embossed structure; and a cathode disposed on the light emitting layer.

21 Claims, 4 Drawing Sheets

(56) References Cited

U.S. PATENT DOCUMENTS

| | | | |
|---|---|---|---|
| 2002/0022148 A1* | 2/2002 | Yudasaka | 428/690 |
| 2002/0079835 A1* | 6/2002 | Lee | 313/506 |
| 2002/0101155 A1* | 8/2002 | Kimura | 313/506 |
| 2002/0118271 A1* | 8/2002 | Mashimo et al. | 347/241 |
| 2003/0062520 A1* | 4/2003 | Toguchi et al. | 257/40 |
| 2003/0117067 A1* | 6/2003 | Roitman et al. | 313/504 |
| 2004/0012980 A1* | 1/2004 | Sugiura et al. | 362/560 |
| 2004/0140465 A1* | 7/2004 | Kimura | 257/40 |
| 2004/0217702 A1* | 11/2004 | Garner et al. | 313/512 |
| 2006/0007552 A1* | 1/2006 | Takakuwa et al. | 359/619 |
| 2007/0069642 A1* | 3/2007 | Kitai et al. | 313/511 |
| 2007/0096642 A1* | 5/2007 | Lee et al. | 313/506 |
| 2008/0211396 A1* | 9/2008 | Kimura | 313/504 |
| 2010/0117524 A1* | 5/2010 | Hente et al. | 313/504 |
| 2010/0141123 A1* | 6/2010 | Joo et al. | 313/504 |

FOREIGN PATENT DOCUMENTS

| | | |
|---|---|---|
| KR | 1020060080638 A | 7/2006 |
| KR | 1020070065681 A | 6/2007 |
| KR | 100773992 B1 | 10/2007 |
| KR | 1020070117894 A | 12/2007 |
| KR | 1020080042275 A | 5/2008 |
| KR | 1020080047725 A | 5/2008 |

OTHER PUBLICATIONS

Han, et al., Preparation and optical properties of polystyrene nanocapsules containing photochromophores, Optical Materials 21 (2002) pp. 579-583.

Muller, et al., Dye-Containing Polymer Beads as Photonic Crystals, Chem. Mater., vol. 12, No. 8, 2000, pp. 2508-2512.

* cited by examiner

ORGANIC LIGHT EMITTING DEVICE AND METHOD OF MANUFACTURING THE SAME

CROSS-REFERENCE TO RELATED APPLICATION

This application claims priority to Korean Patent Application No. 10-2008-0122603, filed on Dec. 4, 2008, and all the benefits accruing therefrom under 35 U.S.C. §119, the contents of which in its entirety is herein incorporated by reference.

BACKGROUND

1. Field

One or more embodiments relate to an organic light emitting device ("OLED") and a method of manufacturing the OLED.

2. Description of the Related Art

An organic light emitting device ("OLED") uses a phenomenon wherein light is generated when a current or a voltage is applied to an organic light emitting layer and electrons and electron holes are combined in the organic light emitting layer. In a polymer OLED, the organic light emitting layer may include a polymer. Also, since a polymer OLED may be manufactured using a wet process, a cost of materials may be reduced and a manufacturing process may be simplified.

The polymer OLED may be driven by a low voltage, provide high-luminance surface emission, have a high response speed and may be thin. Moreover, the OLED may have excellent color reproduction, a wide viewing angle and the emitted color may be selected by appropriate selection of a fluorescent material. Such an OLED may be applied in various devices such as a full color display device, a backlight unit for a liquid crystal display ("LCD"), an information display device, a vehicle display device or a lighting device.

In an OLED for the lighting device, the amount of light generated per light emitting area increases linearly, therefore when the lighting device has a large area, the lighting device may have a long life due to low luminance. However, in this case, due to an increased area of a substrate in the OLED, a cost of materials and processes may increase. It is therefore desirable to have an OLED, which provides reduced materials cost and can be manufactured without complex processes.

SUMMARY

One or more embodiments include an organic light emitting device ("OLED") and a method of manufacturing the OLED.

Additional aspects, features and advantages are set forth in the description which follows.

To achieve the above and/or other aspects, features or advantages, one or more embodiments includes an OLED including: a substrate; a plurality of polymer beads disposed on the substrate; a light emitting layer covering the plurality of polymer beads and having an embossed structure; and a cathode disposed on the light emitting layer.

The OLED may further include an anode interposed between the substrate and the polymer beads. In an embodiment, a hole transport layer ("HTL") may be interposed between the plurality of polymer beads and the light emitting layer, the HTL including a conductive polymer.

The anode may be disposed between the plurality of polymer beads and the light emitting layer. In an embodiment, an HTL may be interposed between the anode and the light emitting layer, the HTL including a conductive polymer.

The diameter of the plurality of polymer beads may be between about 0.1 micrometers ("µm") and about 2 µm. The plurality of polymer beads may include polystyrene, polymethyl methacrylate ("PMMA"), polycarbonate, a copolymer thereof or a combination including at least one of the foregoing.

The plurality of polymer beads may include a fluorescent dye. The fluorescent dye may include a coumarin, a sulforhodamine, a pyrromethane or a combination including at least one of the foregoing.

To achieve the above and/or other aspects, features or advantages one or more embodiments includes a method of manufacturing an OLED, the method including: disposing a plurality of polymer beads on a substrate; disposing a light emitting layer on the substrate to cover the polymer beads, the light emitting layer including a polymer; and disposing a cathode on the light emitting layer.

The plurality of polymer beads and the light emitting layer may be disposed using a wet process. The wet process may include a spin coating process, a roll-to-roll process, an inkjet printing process, a dispensing process, a screen printing process or a combination including at least one of the foregoing. The method may further include disposing an anode on the substrate. The method may further include disposing a hole transport layer including a polymer to cover the plurality of polymer beads using a wet process after the disposing of the plurality of polymer beads on the substrate. The method may further include disposing an anode to cover the plurality of polymer beads after the disposing of the plurality of polymer beads on the substrate. The method may further include disposing a hole transport layer on the anode using a wet process, the hole transport layer including a conductive polymer. In an embodiment, the disposing of the plurality of polymer beads further comprises mixing the plurality of polymer beads with a conductive polymer and coating the plurality of polymer beads.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
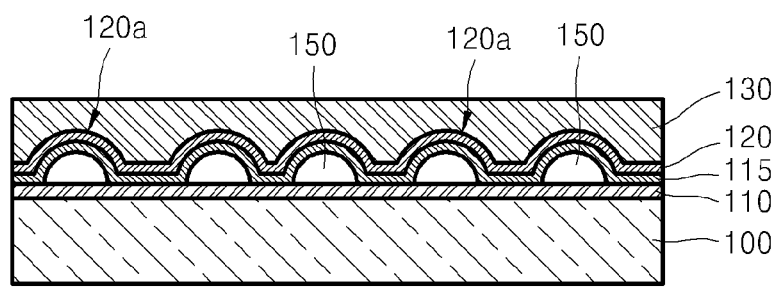
FIG. 1 is a cross-sectional view schematically illustrating an exemplary embodiment of an organic light emitting device ("OLED")

Reference will now be made in detail to embodiments, examples of which are illustrated in the accompanying drawings, wherein like reference numerals refer to like elements throughout, and the sizes and thicknesses of layers and regions are exaggerated for clarity.

The exemplary embodiments of the invention may be embodied in many different forms and should not be construed as being limited to the embodiments set forth herein. Rather, these embodiments are provided so that this disclosure will be thorough and complete and will fully convey the concept of the invention to those skilled in the art, and the exemplary embodiments of the invention will only be defined by the appended claims.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments of the invention.

Spatially relative terms, such as "below," "lower," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device can be otherwise oriented (rotated 90 degrees or at other orientations) and the spatially relative descriptors used herein interpreted accordingly.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Figure 2:
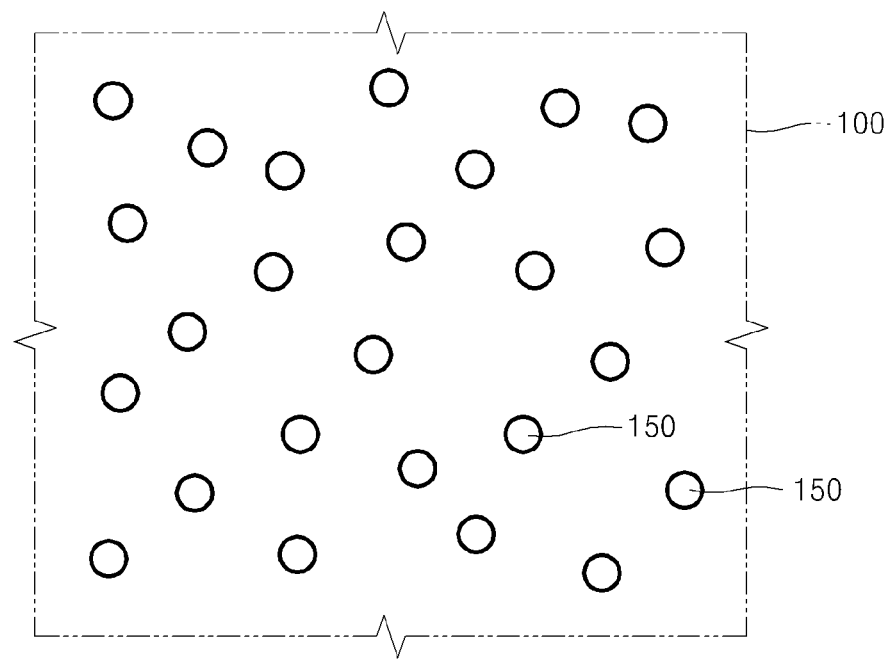
FIG. 2 is a plan view partially illustrating the OLED of FIG. 1.

FIG. 1 is a cross-sectional view schematically illustrating an organic light emitting device ("OLED") according to an embodiment, and FIG. 2 is a plan view partially illustrating the OLED of FIG. 1.

Referring to FIGS. 1 and 2, the OLED includes an anode 110, a plurality of polymer beads 150, a light emitting layer 120 and a cathode 130 sequentially disposed in the stated order on a substrate 100. The substrate 100 may be transparent and may comprise, for example, a glass, a plastic, or the like or a combination comprising at least one of the foregoing. In an embodiment, the substrate 100 may consist essentially of a glass, a plastic, or the like or a combination thereof. In another embodiment, the substrate 100 may consist of a glass, a plastic, or the like or a combination thereof. The anode 110 is disposed on the substrate 100. The anode 110 may be formed by depositing a transparent conductive material, such as Indium Tin Oxide ("ITO"), Indium Zinc Oxide ("IZO"), $SnO_2$, $ZnO_2$, or the like or a combination comprising at least one of the foregoing onto the substrate 100.

The plurality of polymer beads 150 are disposed on the anode 110. The plurality of polymer beads 150 may be partially melted by a heat treatment, which is further described below, and may be disposed on the anode 110 in a hemispherical form. The plurality of polymer beads 150 are used to form the light emitting layer 120 having an embossed structure and may have a diameter between about 0.1 micrometers ("μm") and about 2 μm, specifically between about 0.2 μm and about 1.5 μm, more specifically about 1 μm. However, the present embodiment is not limited thereto. The plurality of polymer beads 150 may comprise a polymer, which is transparent to visible light. For example, the plurality of polymer beads 150 may comprise polystyrene, polymethyl methacrylate ("PMMA"), polycarbonate, a copolymer thereof, or the like or a combination comprising at least one of the foregoing. In an embodiment, the plurality of polymer beads 150 may consist essentially of polystyrene, PMMA, polycarbonate, a copolymer thereof, or the like or a combination thereof. In another embodiment, the plurality of polymer beads 150 may consist of polystyrene, PMMA, polycarbonate, a copolymer thereof, or the like or a combination thereof. However, the present embodiment is not limited thereto.

A hole transport layer ("HTL") 115 may be further disposed on the anode 110 to cover the plurality of polymer beads 150. The HTL 115 transports holes to the light emitting layer 120 and may comprise, for example, a conductive polymer such as (poly(3,4-ethylenedioxythiophene) doped with PSS (poly(4-styrene sulfonate) ("PEDOT/PSS"), or the like. In an embodiment, the HTL 115 may consist essentially of PEDOT/PSS. In another embodiment, the HTL 115 may consist of PEDOT/PSS. However, the present embodiment is not limited thereto.

The light emitting layer 120, which emits light having a selected color due to electroluminescence ("EL"), is disposed on the HTL 115. A plurality of protrusion parts 120a, which correspond to the plurality of polymer beads 150, are disposed on the light emitting layer 120. Accordingly, the light emitting layer 120 may have an embossed structure. The light emitting layer 120 may comprise a polymer and may be, for example, a red light emitting layer, a green light emitting layer, or a blue light emitting layer. The cathode 130 is disposed on the light emitting layer 120. The cathode 130 may be formed by depositing a metal, such as aluminum (Al), silver (Ag), magnesium (Mg), lithium (Li), or calcium (Ca), Barium (Ba), an alloy thereof, or the like or a combination comprising at least one of the foregoing onto the light emitting layer 120.

As above, due to the plurality of polymer beads 150 coated on the anode 110, the light emitting layer 120 has an embossed structure and thus, a light emitting surface area of the light emitting layer 120 may be increased. Accordingly, luminance may be increased and as a result, long-life and low-priced OLEDs for lighting may be provided.

Figure 3:
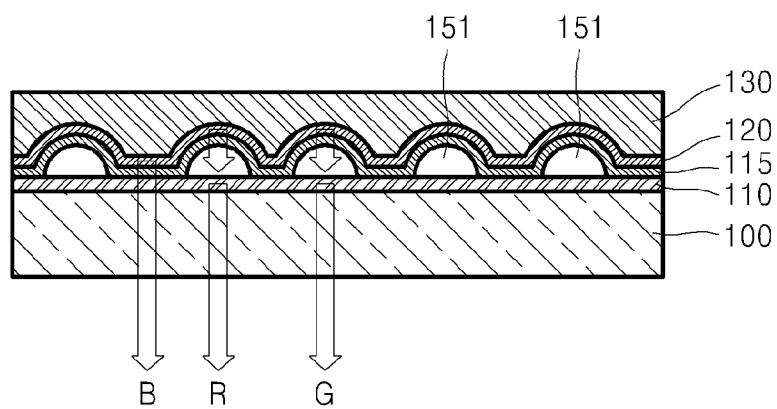
FIG. 3 is a cross-sectional view schematically illustrating an exemplary embodiment of an OLED according to another embodiment.

FIG. 3 is a cross-sectional view schematically illustrating an OLED according to another embodiment. The OLED of FIG. 3 is same as the OLED of FIG. 1, except that a fluorescent dye is included in polymer beads 151 in FIG. 3, thus hereinafter, only the differences will be described.

Referring to FIG. 3, a fluorescent dye (not illustrated) for photoluminescence ("PL") is included in the plurality of polymer beads 151, which are disposed on the anode 110. In an embodiment, the polymer beads 151 may be coated on the anode 110. In an embodiment, the fluorescent dye is a PL material, which is excited by light having a selected color emitted from the light emitting layer 120 by EL. The fluorescent dye may include, for example, a coumarin, a sulforhodamine, a pyrromethane, or the like or a combination comprising at least one of the foregoing, but is not limited thereto. As above, if the fluorescent dye, which emits light having a selected color by PL, is included in the plurality of polymer beads 151, the OLED may generate white light.

In an embodiment, in order to provide white light, the light emitting layer 120 may generate blue light B, and a fluorescent dye emitting red light R and fluorescent dye emitting green light G may be included in the plurality of polymer beads 151. In an embodiment, blue light B due to EL is emitted from the spaces between the plurality of polymer beads 151, and red light R and green light G due to PL are emitted from the plurality of polymer beads 151, thereby forming white light. However, the present embodiment is not limited thereto and white light may be provided in various other ways. For example, when the light emitting layer 120 generates cyan light due to EL and a fluorescent dye, which generates orange light due to PL, is included in the plurality of polymer beads 151, white light may be formed.

Figure 4:
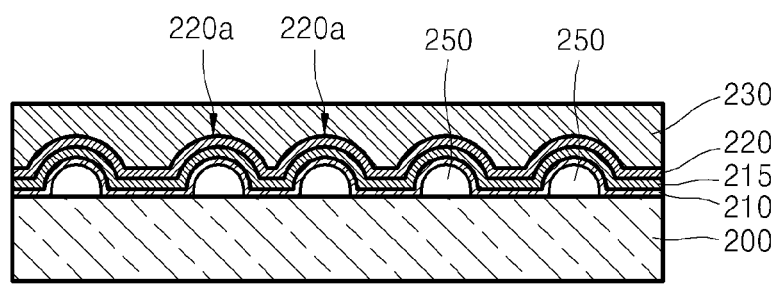
FIG. 4 is a cross-sectional view schematically illustrating an exemplary embodiment of an OLED according to another embodiment.

FIG. 4 is a cross-sectional view schematically illustrating the OLED according to another embodiment.

Referring to FIG. 4, the OLED includes a plurality of polymer beads 250, an anode 210, a light emitting layer 220 and a cathode 230 sequentially disposed in the stated order on a substrate 200. Unlike the previous embodiments, the plurality of polymer beads 250 are firstly disposed on the substrate 200 and the anode 210 is disposed on the substrate 200 to cover the plurality of polymer beads 250 in the present embodiment. In this embodiment, the plurality of polymer beads 250 and the anode 210 are as described above and thus further detailed description thereof is omitted. Moreover, a fluorescent dye (not illustrated), which generates light having a selected color due to PL, may be further included in the plurality of polymer beads 250, as described above.

A hole transport layer ("HTL") 215, which comprises a conductive polymer such as PEDOT/PSS, may be further disposed on the anode 210. The light emitting layer 220, which emits light having a selected color due to EL, is disposed on the HTL 215. In this embodiment, a plurality of protrusion parts 220a, which correspond to the plurality of polymer beads 250, are disposed on the light emitting layer 220, and thus the light emitting layer 220 has an embossed structure. The light emitting layer 220 may comprise a polymer and the cathode 230 is disposed on the light emitting layer 220.

In the present embodiment, due to the plurality of polymer beads 250 disposed on the substrate 200, the light emitting layer 220 has an embossed structure, thereby increasing a light emitting surface area of the light emitting layer 220 and luminance of the OLED.

Hereinafter, a method of manufacturing the OLED according to the above embodiments is described with reference to FIGS. 5 through 8.

Figure 5:
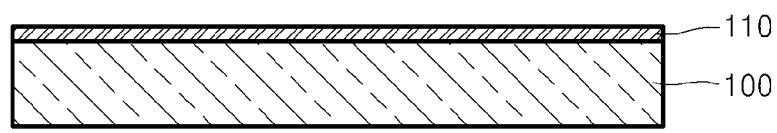
FIGS. 5 through 8 are cross-sectional diagrams illustrating an exemplary embodiment of a method of manufacturing the OLED of FIG. 1.

Referring to FIG. 5, the anode 110 is disposed on the substrate 100. The substrate 100 may comprise a transparent material, such as a glass, a plastic, or the like or a combination comprising at least one of the foregoing. The anode 110 may be formed by depositing a transparent conductive material, such as ITO, IZO, $SnO_2$, $ZnO_2$, or the like or a combination comprising at least one of the foregoing onto the substrate 100.

Figure 6:
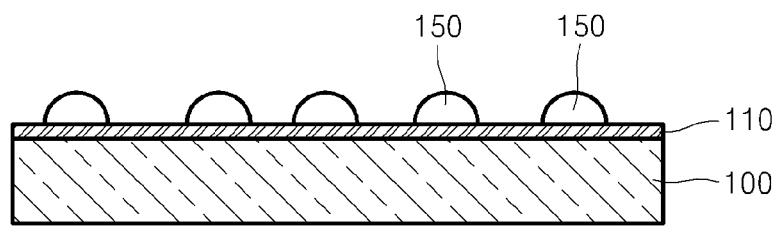

Referring to FIG. 6, the plurality of polymer beads 150 are disposed on the anode 110. In this embodiment, the plurality of polymer beads 150 may have a diameter between about 0.1 μm and about 2 μm, specifically between about 0.2 μm and about 1.5 μm, more specifically about 1 μm, and may comprise a polymer, such as polystyrene, PMMA, polycarbonate, a copolymer thereof, or the like or a combination comprising at least one of the foregoing, which are transparent to visible light. However, the present embodiment is not limited thereto. A fluorescent dye, which generates light having a selected color by PL, may be further included in the plurality of polymer beads 150. The plurality of polymer beads 150 may be disposed by using a wet process. More specifically, water, in which the plurality of polymer beads 150 are dispersed, is coated on the anode 110 using spin coating, or the like, and is dried, thereby coating the plurality of polymer beads 150 on the anode 110. Also, the spin coating may be repeated twice or more as desired. Then, when the substrate 100 is heat treated at a selected temperature so as to soften or melt the plurality of polymer beads 150, the plurality of polymer beads 150 on the anode 110 are partially melted and thus may attach on the anode 110 in a hemispherical form. In the present embodiment, the spin coating is used as the wet process but another wet process, such as a roll-to-roll process, an inkjet printing process, a dispensing process, or a screen printing process, may be used for coating the plurality of polymer beads 150. Moreover, the plurality of polymer beads 150 may be disposed on the anode 110 by coating a mixture of water, in which the plurality of polymer beads 150 are dispersed, and a conductive polymer, for example, PEDOT/PSS, onto the anode 110 using the wet process.

Figure 7:
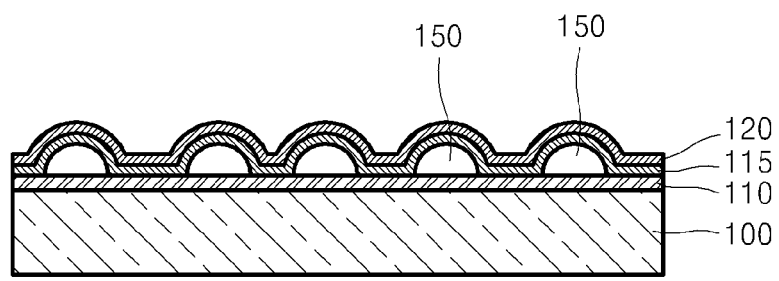

Referring to FIG. 7, the HTL 115 may be further disposed on the anode 110 so as to cover the plurality of polymer beads 150. The HTL 115 may comprise a conductive polymer such as PEDOT/PSS. The HTL 115 may be disposed using a wet process such as spin coating, a roll-to-roll process, an inkjet printing process, a dispensing process, or the like or a combination comprising at least one of the foregoing. The light emitting layer 120, comprising a selected polymer, may be disposed on the HTL 115. In this embodiment, the light emitting layer 120 may also be disposed using a wet process. The light emitting layer 120 may comprise an embossed structure corresponding to the plurality of polymer beads 150.

Figure 8:
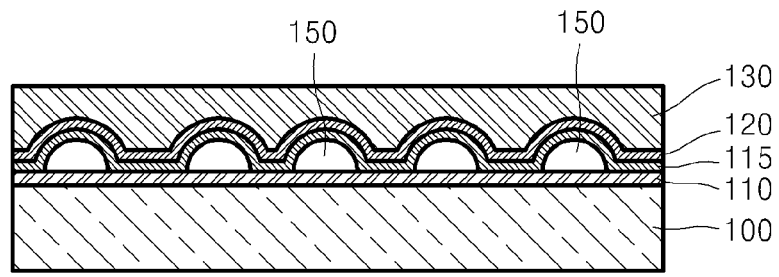

Referring to FIG. 8, the cathode 130 is disposed on the light emitting layer 120. The cathode 130 may be formed on the light emitting layer 120 by depositing a metal, such as aluminum (Al), silver (Ag), magnesium (Mg), lithium (Li), calcium (Ca), Barium (Ba), an alloy thereof, or the like or a combination comprising at least one of the foregoing onto the light emitting layer 120.

As above, the anode 110 is disposed on the substrate 100 and then, the plurality of polymer beads 150 are disposed on the anode 110. In an embodiment, the plurality of polymer beads 150 may be firstly coated on the substrate 100 and then the anode 110 may be disposed on the substrate 100 to cover the plurality of polymer beads 150.

As described above, according to one or more of the above embodiments, a light emitting layer having an embossed structure is disposed to comprise polymer beads, thereby increasing a light emitting surface area of the light emitting layer and luminance of an OLED. Due to an increase in luminance, a long-life and low priced OLED may be provided. In addition, when a fluorescent dye is included in the polymer beads, an OLED, which emits white light, may be provided. Moreover, since the polymer beads comprise a polymer, an HTL and the light emitting layer may be disposed using a wet process, and a process for manufacturing the OLED may be simplified and a cost of manufacture may be reduced.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An organic light emitting device comprising:
a substrate;
a plurality of polymer beads disposed on the substrate, the polymer beads having a lower surface adjacent to the substrate and an opposite upper surface, wherein each of the polymer beads are non-abutting;
an anode disposed on the substrate; where the anode lies between the plurality of polymer beads and the substrate and is in direct contact with the substrate and the plurality of polymer beads;
a light emitting layer covering the plurality of polymer beads and having an embossed structure; and
a cathode disposed on the light emitting layer,
wherein a shape of a first portion of the light emitting layer corresponds to a shape of the upper surface of the polymer beads, and a shape of a second portion of the light emitting layer corresponds to a shape of the substrate between the non-abutting polymer beads.

2. The organic light emitting device of claim 1, further comprising a hole transport layer interposed between the plurality of polymer beads and the light emitting layer, the hole transport layer comprising a conductive polymer.

3. The organic light emitting device of claim 1, further comprising a hole transport layer interposed between the anode and the light emitting layer, the hole transport layer comprising a conductive polymer.

4. The organic light emitting device of claim 1, wherein the diameter of the plurality of polymer beads is between about 0.1 micrometers and about 2 micrometers.

5. The organic light emitting device of claim 1, wherein the plurality of polymer beads comprises polystyrene, polymethyl methacrylate, polycarbonate, a copolymer thereof or a combination comprising at least one of the foregoing.

6. The organic light emitting device of claim 5, wherein the polymer beads comprise polystyrene, polycarbonate, a copolymer thereof, or a combination comprising at least one of the foregoing.

7. The organic light emitting device of claim 1, wherein the plurality of polymer beads comprises a fluorescent dye.

8. The organic light emitting device of claim 1, wherein the fluorescent dye comprises a coumarin, a sulforhodamine, a pyrromethane or a combination comprising at least one of the foregoing.

9. The organic light emitting device of claim 1, wherein an entirety of the polymer beads are non-abutting.

10. A method of manufacturing an organic light emitting device, the method comprising:
disposing a plurality of polymer beads dispersed in a fluid on a substrate, the polymer beads having a lower surface adjacent to the substrate and an opposite upper surface; then
heat treating the polymer beads to form a hemispherical upper surface;
disposing a light emitting layer on the substrate to cover the polymer beads, the light emitting layer comprising a polymer; and
disposing a cathode on the light emitting layer,
wherein the light emitting layer has an embossed structure which corresponds to the hemispherical upper surface of the polymer beads and the substrate between adjacent polymer beads.

11. The method of claim 10, wherein the plurality of polymer beads and the light emitting layer are disposed using a wet process.

12. The method of claim 11, wherein the wet process comprises a spin coating process, a roll-to-roll process, an inkjet printing process, a dispensing process, a screen printing process or a combination comprising at least one of the foregoing processes.

13. The method of claim 11, further comprising disposing an anode on the substrate.

14. The method of claim 11, further comprising disposing a hole transport layer comprising a polymer to cover the plurality of polymer beads using a wet process after the disposing of the plurality of polymer beads on the substrate.

15. The method of claim 11, further comprising disposing an anode to cover the plurality of polymer beads after the disposing of the plurality of polymer beads on the substrate.

16. The method of claim 15, further comprising disposing a hole transport layer on the anode using a wet process, the hole transport layer comprising a conductive polymer.

17. The method of claim 11, wherein the disposing of the plurality of polymer beads further comprises mixing the plurality of polymer beads with a conductive polymer and coating the plurality of polymer beads.

18. The method of claim 11, wherein the plurality of polymer beads comprise a fluorescent dye.

19. The method of claim 11, wherein the diameter of the plurality of polymer beads is between about 0.1 micrometers and about 2 micrometers.

20. The method of claim 10, wherein the polymer beads comprise polystyrene, polycarbonate, a copolymer thereof, or a combination comprising at least one of the foregoing.

21. An organic light emitting device comprising:
  a substrate;
  an anode disposed upon the substrate;
  a plurality of polymer beads disposed on the substrate, the polymer beads having a lower surface adjacent to the substrate and an opposite upper surface; where the anode is in direct contact with the substrate and the plurality of polymer beads and lies between the substrate and the polymer beads;
  a light emitting layer covering the plurality of polymer beads and having an embossed structure; and
  a cathode disposed on the light emitting layer,
  wherein the embossed structure of the light emitting layer corresponds to the upper surface of the polymer beads and the substrate between adjacent polymer beads, each of the polymer beads are non-abutting with respect to the lower and upper surfaces of other adjacent polymer beads, and
  wherein the polymer beads comprise polystyrene, polycarbonate, a copolymer thereof, or a combination comprising at least one of the foregoing.

* * * * *